United States Patent
Pataut et al.

Patent Number: 5,418,449
Date of Patent: May 23, 1995

[54] DEVICE FOR THE DETECTION OF POWER AT THE OUTPUT OF AN ELECTRONIC CIRCUIT

[75] Inventors: Gérard Pataut, Gif sur Yvette, France; Stefan Dietsche, Dreieich Allemagne, Germany

[73] Assignee: Thomson-CSF Semiconducteurs Specifiques, Paris, France

[21] Appl. No.: 161,271

[22] Filed: Dec. 3, 1993

[30] Foreign Application Priority Data

Dec. 11, 1992 [FR] France .................. 92 14950

[51] Int. Cl.⁶ ........................................ G01R 21/10
[52] U.S. Cl. ................................. 324/95; 329/368; 329/369; 329/370; 333/32; 327/552; 327/558
[58] Field of Search ............. 307/550, 520; 333/32; 324/95; 329/368, 369, 370

[56] References Cited

U.S. PATENT DOCUMENTS

| | | | |
|---|---|---|---|
| 4,143,330 | 3/1979 | Nagasawa | 329/101 |
| 4,431,965 | 2/1984 | Aslan . | |
| 4,647,848 | 3/1987 | Barrett . | |

FOREIGN PATENT DOCUMENTS 0210373 2/1987 European Pat. Off. .
4132257 4/1993 Germany .

*Primary Examiner*—Kenneth A. Wieder
*Assistant Examiner*—Mark Wardas
*Attorney, Agent, or Firm*—Oblon, Spivak, McClelland, Maier & Neustadt

[57] ABSTRACT

The disclosure relates to the servo-control of an electronic circuit that calls for the detection of the power delivered at its output. The disclosed device is essentially constituted by a field-effect transistor with zero bias $V_{DS}$ mounted between the ground and a matching network at output of the circuit. This transistor behaves either like a capacitor or like a diode. A low-pass filter, connected between the transistor and the network, delivers a detection voltage $V_{det}$.

1 Claim, 1 Drawing Sheet

DEVICE FOR THE DETECTION OF POWER AT THE OUTPUT OF AN ELECTRONIC CIRCUIT

BACKGROUND OF THE INVENTION

The present invention relates to a device for the detection of power at the output of an electronic circuit such as a power amplifier comprising at least one field effect transistor and one matching network at output.

A matching network at output is understood to mean a network designed to improve or match an electrical characteristic of the circuit. It may be an impedance matching network for example, or a harmonics rejection network in a frequency generator or at the output of an amplifier which, as laid down by a standard, must short-circuit at the second harmonic or to be in an open circuit state at the third harmonic (for example, a class F amplifier). More generally, it is quite rare for an electronic circuit not to have, at its output, a network essentially comprising resistors, inductors and capacitors in order to match it to a specification.

The device according to the invention has been designed for applications in the microwave range (one to several tens of GHZ) but it can also be applied to circuits working at lower frequencies.

The object of this device is the detection of an electrical power present at an output terminal of a circuit: the detection signal can be used to activate an electrical signal that was hitherto dormant, or to servocontrol the supply of a transistor or, again, to trigger an alarm signal for example.

The power detection function is well known per se, and its application is very common in stabilized current or voltage supplies. The principle thereof is given in FIG. 1. In an assembly comprising an electronic circuit 1, such as an amplifier, capable of modulating the current delivered between the input terminals "i" and the output terminals "o", this current I is detected by the voltage created at the terminals of a high value resistor 2. The voltage $V_{det}$ for the detection of the current I is actually taken at the anode of a diode 3. A high-value resistor 5 at the detection output matches the impedance for the measuring apparatus.

In the device according to the invention, the power detection is achieved by means of a field-effect transistor that is integrated with a matching network comprising at least one inductor and one capacitor. This transistor meets a twofold specification: its gate is grounded and the transistor is not biased, so that it behaves either like a capacitor or like a diode, depending on whether or not it detects a current in the circuit. The field-effect transistor, by its equivalent capacitance, participates in the matching network.

SUMMARY OF THE INVENTION

More specifically, the invention relates to a device for the detection of power at the output of an electronic circuit working in the microwave field and comprising a matching device between its output and the ground, this device for the detection of power at output being incorporated into the matching network and being mounted between said network and the ground.

BRIEF DESCRIPTION OF THE DRAWING

The invention will be understood more clearly from the description that now follows of an exemplary application, made with reference to the appended figures of which.

MORE DETAILED DESCRIPTION

The device according to the invention can be applied to any circuit in which there flows a certain amount of electrical power. However, in order to make the description of the invention clearer, it will be based on the already-mentioned example of an amplifier working according to precise specifications, for example the class F amplifier where the specifications require that it should be provided at output with a frequency rejection filter.

Figure 1:
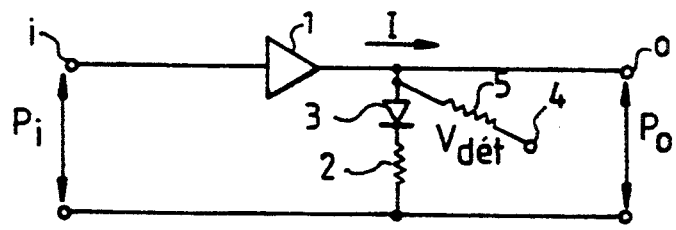
FIG. 1 is a skeleton diagram of power detection according to the prior art.
Figure 2:
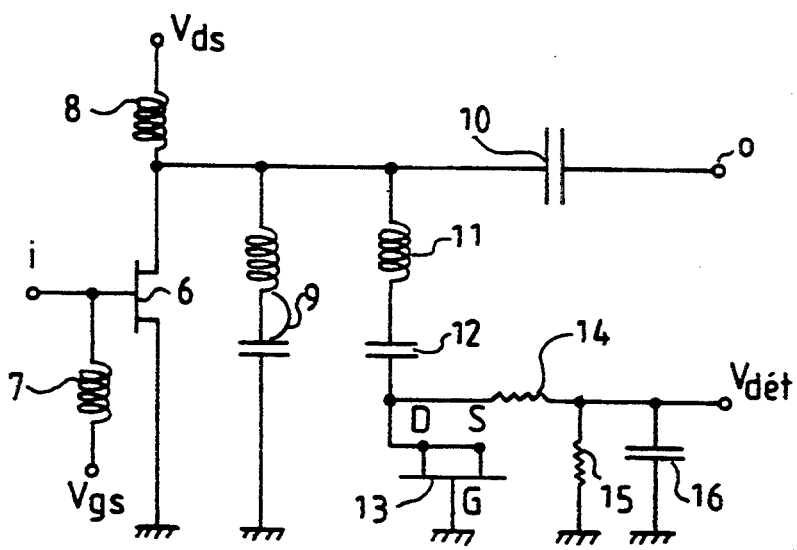
FIG. 2 is a diagram of the power detection device according to the invention.

FIG. 2 shows an amplifier such as this. This amplifier can be simplified and symbolized by a field-effect transistor 6. The input of a signal is taken at its gate, at "i" and the amplified signal is collected at the output "o", possibly through a coupling capacitor 10, at the drain of the transistor. The circuits for the decoupling of the gate bias voltage $V_{gs}$ and drain bias voltage $V_{ds}$ are represented by their inductors 7 and 8, and an auxiliary circuit such as 9 may act as a frequency filter or impedance matching filter.

In order to meet the specifications laid down for this amplifier, it also has a harmonic rejection network at its output. This harmonic rejection network has at least one inductor 11 and one capacitor 12. Normally, outside the context of the invention, this network is grounded and makes it possible to set the coupling at the fundamental frequency and to choose the second order or higher order harmonics that are presented at the output of the amplifier. For example, it short-circuits at the second harmonic but is in a state of open circuit at the third harmonic.

However, according to the invention, this harmonic rejection network 11+12 is series-connected with a field-effect transistor 13 having its gate G grounded and its source S and drain D short-circuited: this transistor 13 is therefore a transistor with zero drain-source bias voltage, and it is non-biased.

The power delivered at the output "o" of the amplifier is detected by means of a low-pass filter formed by the resistors 14 and 15 and the capacitor 16. This low-pass filter is connected to the rejection network, between the capacitor 12 and the transistor 13 and, at its output, it delivers a signal $V_{det}$ for the detection of power at the output "o" of the amplifier.

Figure 3:
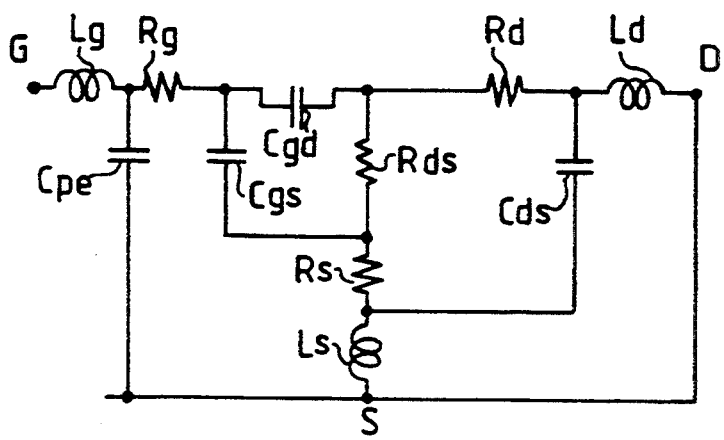
FIG. 3 is an equivalent electrical diagram of a non-biased transistor.

With respect to a harmonic filtered by the rejection network, the field-effect transistor 13 biased at zero drain-source voltage $V_{ds}=0$ behaves essentially like a capacitor as can be seen in FIG. 3, which shows the electrical diagram of a transistor called a "cold" transistor, i.e. a transistor in which $V_{ds}=0$ because the source and drain electrodes are short-circuited. The equivalent diagram of a transistor such as this is essentially a capacitor $C_{gs}$ in parallel with $C_{gd}$, to which it is necessary to add the input parasitic capacitor $C_{pe}$ to complete the equivalent diagram. Thus, the harmonic frequency rejection network, for an $n > 2$ order harmonic, is constituted by the inductor 11 and the equivalent capacitor_

$C_{eg}$ equal to the sum of the capacitor 12 and the capacitor of the "cold" transistor 13 ($C_{gs}+C_{gd}+C_{pe}$).

Figure 4:
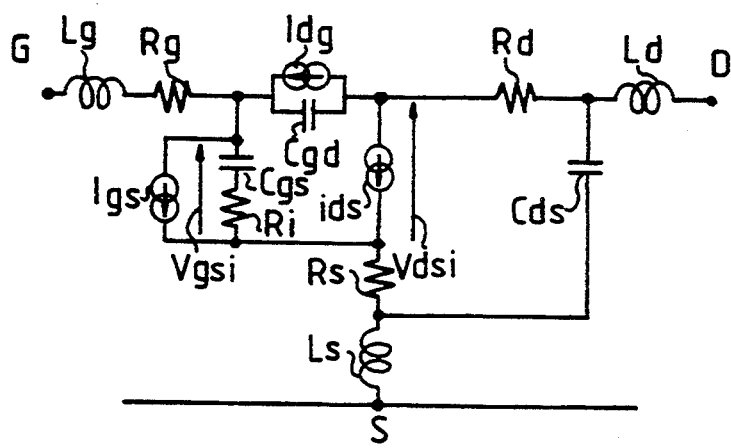
FIG. 4 is a non-linear electrical diagram of a field-effect transistor.

For a signal at the fundamental frequency, not filtered by the rejection network 11+12, the non-linear diagram shown in FIG. 4 must be considered for the transistor 13.

A very small part of the signal at the fundamental frequency goes through the rejection filter 11+12 and this low amplitude of the signal at the fundamental frequency applied to the transistor 13 is sufficient to give a current proportional to the power delivered at the output "o". This detection current is represented in FIG. 4 by the sum of the currents $I_{dg}$, $I_{gs}$ that did not exist in the equivalent diagram of FIG. 3. It is essentially $I_{dg}$ and $I_{gs}$ that give the power detection current, converted by the network of resistors 14 and 15 into a voltage $V_{det}$ proportional to the power existing at the output "o".

The rejection network 11+12 can be used to check the losses in the fundamental frequency and to set the harmonic rejection. The detection network 14+15+16 is a low-pass filter: it has no influence in the microwave range. Similarly, the detector transistor 13 is uncoupled from the output: it creates little disturbance in the operation and, as a detector, induces only a small loss of power available at the Output "0".

The invention has been explained with reference to the example of an amplifier having at least one harmonic in addition to the fundamental frequency. It is clear to those skilled in the art that the same power detection device can be applied to other electronic functions such as those of a mixer, an oscillator, etc.

It is also clear that the detection device according to the invention, which is herein incorporated into a harmonic rejection network, may be incorporated into a filtering network that has no harmonic ratio with the fundamental frequency.

Finally, the components of at least the detection device are not necessarily localized type components as shown in the figures. They may be distributed type components.

The device according to the invention has the advantage of including the functions of rejection and detection in a single network, and of being entirely compatible with the manufacturing steps in microwave technology.

It has few components, and this means that these components cause few losses at output, and the coupling of the detection network to the output, which is set by the network 11+12, is weak. This does not disturb the operation of the controlled system, whether it is an amplifier or an oscillator.

The invention is specified by the following claims.

What is claimed is:

1. A device for detecting power output of an electronic circuit, said device comprising:
   a matching network including at least one inductor and one capacitor connected to said output of said electronic circuit;
   a detecting field-effect transistor with zero drain-source bias, wherein a gate of said field-effect transistor is at ground and wherein a source and a drain of said transistor are short-circuited and wherein said field-effect transistor is connected to an output of said matching network; and
   a low-pass filter connected to a common point between said detecting transistor and said matching network, said low-pass filter outputting a detection voltage proportional to current delivered at said output of said electronic circuit.

* * * * *